United States Patent [19]
Somei

[11] Patent Number: 6,023,211
[45] Date of Patent: Feb. 8, 2000

[54] TRANSMISSION CIRCUIT USING STRIP LINE IN THREE DIMENSIONS

[75] Inventor: Junichi Somei, Nara, Japan

[73] Assignee: Sharp Kabushiki Kaisha, Osaka, Japan

[21] Appl. No.: 08/986,306

[22] Filed: Dec. 5, 1997

[30] Foreign Application Priority Data

Dec. 12, 1996 [JP] Japan ..................................... 8-331835

[51] Int. Cl.[7] ................................ H01P 3/08; H05K 1/11
[52] U.S. Cl. ............................ 333/246; 333/33; 174/262
[58] Field of Search ................................... 333/238, 246, 333/260, 33; 361/792; 174/262, 266; 257/728

[56] References Cited

U.S. PATENT DOCUMENTS

| | | | |
|---|---|---|---|
| 4,494,083 | 1/1985 | Josefsson et al. | 333/33 |
| 4,816,791 | 3/1989 | Carnahan et al. | 333/260 X |
| 5,036,301 | 7/1991 | Takao et al. | 333/246 X |
| 5,057,798 | 10/1991 | Moye et al. | 333/33 |
| 5,229,727 | 7/1993 | Clark et al. | 333/246 X |
| 5,401,912 | 3/1995 | Mattei | 333/246 X |
| 5,414,222 | 5/1995 | Sen et al. | 174/262 |
| 5,757,252 | 5/1998 | Cho et al. | 333/246 |

FOREIGN PATENT DOCUMENTS

| | | |
|---|---|---|
| 318311A3 | 5/1989 | European Pat. Off. . |
| 2625373A1 | 12/1987 | France . |
| 62-140503 | 6/1987 | Japan . |
| 5-29852 | 2/1993 | Japan ..................................... 333/246 |
| 5-199019 | 8/1993 | Japan . |
| 1337940 A1 | 9/1987 | U.S.S.R. ................................ 333/246 |

*Primary Examiner*—Robert Pascal
*Assistant Examiner*—Barbara Summons

[57] ABSTRACT

There is provided a transmission circuit using a strip line which can be formed in three dimensions with simple construction and low cost and which has high reliability. A first microstrip line is formed by sandwiching a dielectric substrate 1 between a first strip conductor 2 provided on a top surface of the dielectric substrate 1 and a first grounding conductor 3 provided on a bottom surface of the dielectric substrate 1. A second microstrip line is formed by sandwiching the dielectric substrate 1 between a second strip conductor 4 provided on the bottom surface of the dielectric substrate 1 and a second grounding conductor 5 provided on the top surface of the dielectric substrate 1. The first strip conductor 2 and the second strip conductor 4 are electrically connected to each other by a connecting through hole 11 provided in the dielectric substrate 1.

7 Claims, 4 Drawing Sheets

6,023,211

TRANSMISSION CIRCUIT USING STRIP LINE IN THREE DIMENSIONS

BACKGROUND OF THE INVENTION

The present invention relates to a transmission circuit using a strip line for transmitting microwaves or the like.

In recent years, with the development of equipment that exploit microwaves, there has been a rapid increase in number of transmission circuits equipped with a strip line. An example of this strip line is a microstrip line 90, as shown in FIG. 6, which is so formed that a dielectric substrate 91 is sandwiched between a strip conductor 92 and a grounding conductor 93. In the microstrip line 90, which is a modification of the parallel planar type waveguide, an electric field E and a magnetic field H are given to between the strip conductor 92 and the grounding conductor 93 so that electromagnetic waves are propagated along the microstrip line 90 in a direction vertical to the drawing sheet of FIG. 6. The impedance of the microstrip line 90 depends on width W of the strip conductor 92, thickness h of the dielectric substrate 91, permittivity $\epsilon$ of the dielectric substrate 91 and the like. The microstrip line 90 of this type is planar-structured, small-sized and lightweight, suitable for making of economical transmission lines and superior in compatibility with semiconductor component parts, so that the microstrip line 90 is widely and commonly used primarily as transmission circuits for microwaves.

FIG. 7 shows a sectional view of a transmission circuit using this strip line. The transmission circuit comprises an internal metal chassis 101, a first grounding conductor 102 provided on the top surface side of the internal metal chassis 101, a first dielectric substrate 103 provided on the top surface side of the first grounding conductor 102, a second grounding conductor 104 provided on the bottom surface side of the internal metal chassis 101 and a second dielectric substrate 105 provided on the top surface side of the second grounding conductor 104. Connecting pins 121, 122 are inserted into through holes 151, 152, respectively, which are provided in the internal metal chassis 101, the first grounding conductor 102, the first dielectric substrate 103, the second grounding conductor 104 and the second dielectric substrate 105, and spaced from each other with a specified interval. Then, a metal shielding plate 140 for shielding microwaves is erected in a generally mid point between the through holes 151, 152 on the first dielectric substrate 103. The internal metal chassis 101 strengthens the first and second grounding conductors 102, 104 while the strength of connection of the connecting pins 121, 122 is ensured. Also, cylindrical insulating portions 141, 142 made of synthetic resin are externally fitted to the connecting pins 121, 122, respectively, so that the insulating portions 141, 142 prevent the connecting pins 121, 122 from contacting the internal metal chassis 101 and the first, second grounding conductors 102, 104.

Further, one end of a strip conductor 111 provided on the top surface side of the first dielectric substrate 103 is connected to an upper end of the connecting pin 121 by a soldering portion 131, while one end of a strip conductor 112 provided on the bottom surface side of the second dielectric substrate 105 is connected to a lower end of the connecting pin 121 by a soldering portion 132. The other end of the strip conductor 112 is connected to a lower end of the connecting pin 122 by a soldering portion 134, while an upper end of the connecting pin 122 is connected to one end of the strip conductor 113 provided on the top surface side of the first dielectric substrate 103 by a soldering portion 133.

In this transmission circuit using a strip line, as shown above, a microstrip line formed by sandwiching the first dielectric substrate 103 between the strip conductor 111 and the first grounding conductor 102, a microstrip line formed by sandwiching the second dielectric substrate 105 between the strip conductor 112 and the second grounding conductor 104, and a microstrip line formed by sandwiching the first dielectric substrate 103 between the strip conductor 113 and the first grounding conductor 102 are connected one to another in a crank shape via the connecting pins 121 and 122. Thus, a three-dimensional transmission circuit is made up, by which a microwave signal is transmitted so as to avoid the metal shielding plate 140.

In the transmission circuit using a strip line shown in FIG. 7, microstrip lines are bent into a crank shape by using the connecting pins 121, 122 so as to avoid the metal shielding plate 140. Therefore, the transmission characteristics would be not stable but variable depending on the connecting pins 121, 122, the fitting position and material of the insulating portions 141, 142 externally fitted to the connecting pins 121, 122, the inner diameter of the through holes 151, 152 into which the connecting pins 121, 122 are inserted, the thickness of the internal metal chassis 101 and the like. This would be a large cause of impedance mismatching. Solder quantity of the soldering portions 131 to 134 by which the connecting pins 121, 122 are connected to the strip conductors 111 to 113 may also be a cause of impedance mismatching. Accordingly, in this transmission circuit using a strip line, impedance of the strip line would differ each time a transmission circuit is formed, so that fine adjustment of impedance is necessitated, resulting in a problem that the mass production effect deteriorates considerably. Further, since the above transmission circuit using a strip line is of the structure that different types of materials are stacked up with the internal metal chassis 101 sandwiched by dielectric substrates from top and bottom, mechanical stress would concentrate on the connecting pins 121, 122 because of the differences in thermal expansion coefficient among the materials, resulting in a fear of development to large problems such as pattern peeling.

SUMMARY OF THE INVENTION

An object of the present invention is therefore to provide a transmission circuit using a strip line which circuit allows a transmission line to be formed in three dimensions with simple construction and low cost, and which circuit is of high reliability.

Another object of the present invention is to provide a transmission circuit using a strip line which circuit allows impedance matching to be easily attained, and which circuit can obtain successful transmission characteristics.

Yet another object of the present invention is to provide a transmission circuit using a strip line which circuit can be adapted to the technique of microwave transmission circuits incorporating multi-layer substrates.

In order to achieve the aforementioned objects, the present invention provides a transmission circuit using a strip line, comprising:

a dielectric substrate;

a first strip line having a first strip conductor provided on a top surface of the dielectric substrate and a first grounding conductor provided on a bottom surface of the dielectric substrate;

a second strip line having a second strip conductor provided on a bottom surface of the dielectric substrate and a second grounding conductor provided on a top surface of the dielectric substrate; and a connecting through hole provided in the dielectric substrate, with one end of the connecting through hole electrically connected to one end of the first strip conductor and the other end of the connecting through hole electrically connected to one end of the second strip conductor.

With the transmission circuit using a strip line according to the invention, one end of the first strip conductor and one of the second strip conductor are connected to each other by the connecting through hole, by which the first strip line having the first strip conductor and the second strip line having the second strip conductor are coupled with each other. Thus, the path along which a microwave or other signal is transmitted is bent into a crank shape, so that, for example, a metal shielding plate provided on the top surface of the dielectric substrate is avoided. Accordingly, without using any internal metal chassis or connecting pins or the like, the transmission line can be formed in three dimensions with simple construction and low cost while a high reliability can be obtained. Also, this transmission circuit using a strip line employs a less-variable connecting through hole instead of connecting pins, so that the transmission characteristics become stable and that impedance adjustment can be easily made dispensable.

In one embodiment, impedance adjustment of the connecting through hole is attained by adjusting diameter of the connecting through hole.

According to this embodiment, the impedance of the transmission line of the connecting through hole is adjusted by adjusting the diameter of the connecting through hole. Therefore, impedance matching between the first strip line having the first strip conductor and the second strip line having the second strip conductor can be easily attained, so that the transmission characteristics can be optimized responsive to the impedance of the strip lines.

In one embodiment, an impedance matching part is provided in at least one of the first strip conductor and the second strip conductor.

According to this embodiment, as the impedance matching part, or a branch portion is provided in the first, second strip conductors, and a conductor pattern for fine adjustment is provided opposite to an end of the branch portion with a specified interval thereto, by which the impedance matching between the first, or second strip lines having the first, or second strip conductors, respectively, and an external circuit connected thereto, or the impedance matching between the first, or second strip lines having the first, second strip conductors, or respectively, and the connecting through hole can be easily attained. Accordingly, successful transmission characteristics can be obtained.

An embodiment further comprises a plurality of grounding through holes which are provided in the dielectric substrate so as to surround the connecting through hole and which are electrically connected to the grounding conductor of at least one of the first strip line and the second strip line.

According to this embodiment, a transmission line equivalent to a cylindrical dielectric line is made up with a dielectric sandwiched between the connecting through hole and the grounding through holes. Therefore, the impedance characteristic of the transmission line of the connecting through hole can be made stable and successful transmission characteristics can be obtained at high frequency and wide band.

In one embodiment, distance from a center of the connecting through hole to the first and second grounding conductors is $\lambda/4$ ($\lambda$: signal wavelength).

According to this embodiment, even if a signal propagating along the first strip line is reflected by the second grounding conductor, for example, the signal will never be affected by reflected waves because the distance from the center of the connecting through hole to the second grounding conductor is $\lambda/4$. Therefore, the transmission characteristics can be prevented from deterioration due to discontinuous portions in the gaps between the first and second grounding conductors and the connecting through hole.

Also, the present invention provides a transmission circuit using a strip line, comprising:

a multi-layer substrate formed by stacking up a plurality of dielectric substrates with specified intervals;

a strip line having a strip conductor provided on at least one of top and bottom surfaces of the multi-layer substrate and a grounding conductor provided on a surface opposite to a surface of the dielectric substrate on which the strip conductor is provided;

a strip line having a strip conductor provided in at least one of gaps between the dielectric substrates and a grounding conductor provided on a surface opposite to a surface of the dielectric substrate on which the strip conductor is provided; and a connecting through hole provided so as to pass through the multi-layer substrate, and serving to connect the strip conductors to each other.

According to this invention, the strip conductors are connected to one another by the connecting through hole, by which strip lines formed by using strip conductors are coupled with one another, so that the path along which a microwave or other signal is transmitted is bent so as to avoid, for example, a metal shielding plate provided on the top surface of the dielectric substrate. Accordingly, without using any internal metal chassis or connecting pins or the like, the transmission line can be formed in three dimensions with simple construction and low cost while a high reliability can be obtained. Also, the transmission characteristics become stable, so that impedance adjustment can be easily made dispensable. Therefore, this transmission circuit using a strip line, when applied to the multi-layer technique of microwave transmission circuits, allows the circuit area to be reduced to a large extent and capable of high-density mounting.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
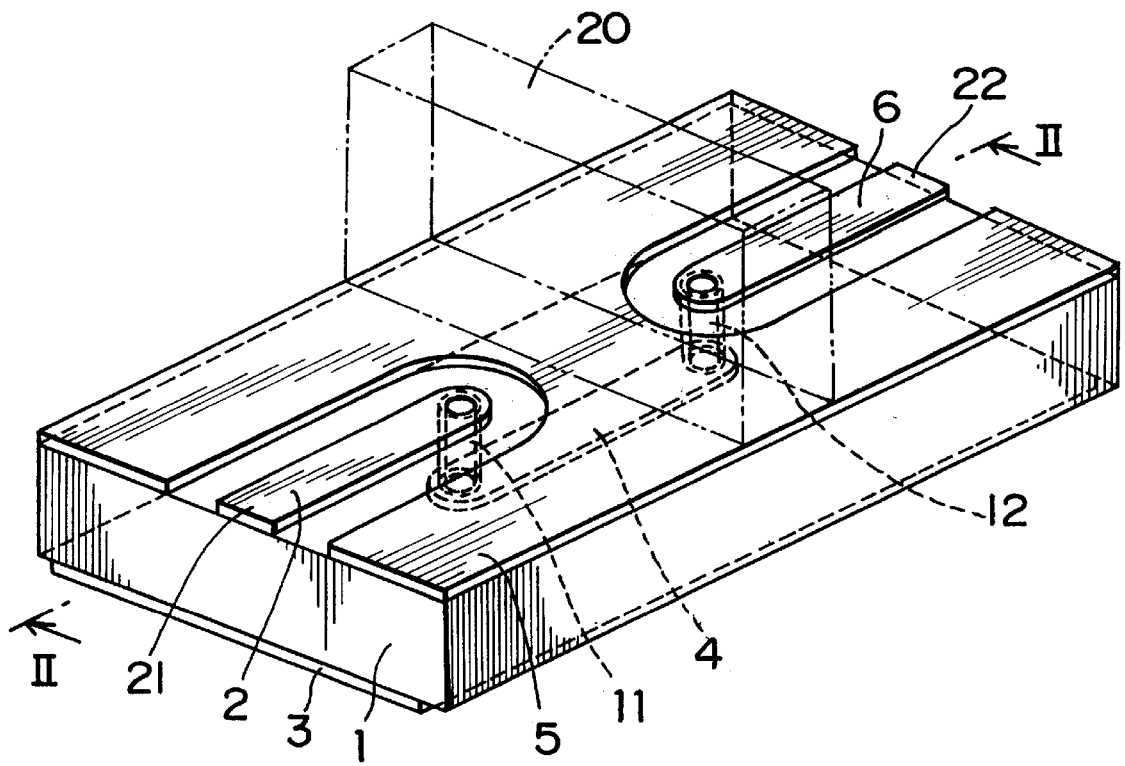
FIG. 1 is a perspective view of a transmission circuit using a strip line according to a first embodiment of the present invention.

Hereinbelow, the transmission circuit using a strip line according to the present invention is described in detail by embodiments thereof illustrated in the drawings.

First Embodiment

FIG. 1 is a perspective view of a transmission circuit using a strip line according to the first embodiment of the present invention. In this transmission circuit, a first strip conductor 2 and a third strip conductor 6 are provided on a line on a top surface side of a dielectric substrate 1 made of PTFE (polytetrafluoroethylene) such that they are spaced with a specified interval, while a second strip conductor 4 is provided on a bottom surface side of the dielectric substrate 1 such that both ends of the second strip conductor 4 are opposed to one end of the first strip conductor 2 and one end of the third strip conductor 6, respectively. A first grounding conductor (first grounding pattern) 3 is provided on part of the bottom surface side of the dielectric substrate 1 excluding the second strip conductor 4 and its peripheries (in FIG. 1, the part of the peripheries of the second strip conductor 4 is omitted for a better viewing of the drawing). Meanwhile, a second grounding conductor (second grounding pattern) 5 is provided on part of the top surface side of the dielectric substrate 1 excluding the first strip conductor 2 and the third strip conductor 6 and their peripheries. Then, one end of the first strip conductor 2 and one end of the second strip conductor 4 are electrically connected to each other by a connecting through hole 11, while the other end of the second strip conductor 4 and one end of the third strip conductor 6 are electrically connected to each other by a connecting through hole 12. The connecting through holes 11, 12 each have a cylindrical-shaped conductor provided in the inner circumference.

This transmission circuit comprises, as an example of the strip line, a first microstrip line formed with the dielectric substrate 1 sandwiched between the first strip conductor 2 and the first grounding conductor 3, a second microstrip line formed with the dielectric substrate 1 sandwiched between the second strip conductor 4 and the second grounding conductor 5, and a third microstrip line with the dielectric substrate 1 sandwiched between the third strip conductor 6 and the first grounding conductor 3. A metal shielding plate 20 is erected between the first strip conductor 2 and the third strip conductor 6 on the top surface side of the second grounding conductor 5. It is noted that an end of the first strip conductor 2 farther from the connecting through hole 11 is a signal input portion 21, that an end of the third strip conductor 6 farther from the connecting through hole 12 is a signal output portion 22 and that the first, second grounding conductors 3, 5 are electrically connected to the chassis or the like of an equipment (not shown) into which this transmission circuit is incorporated.

Figure 2:
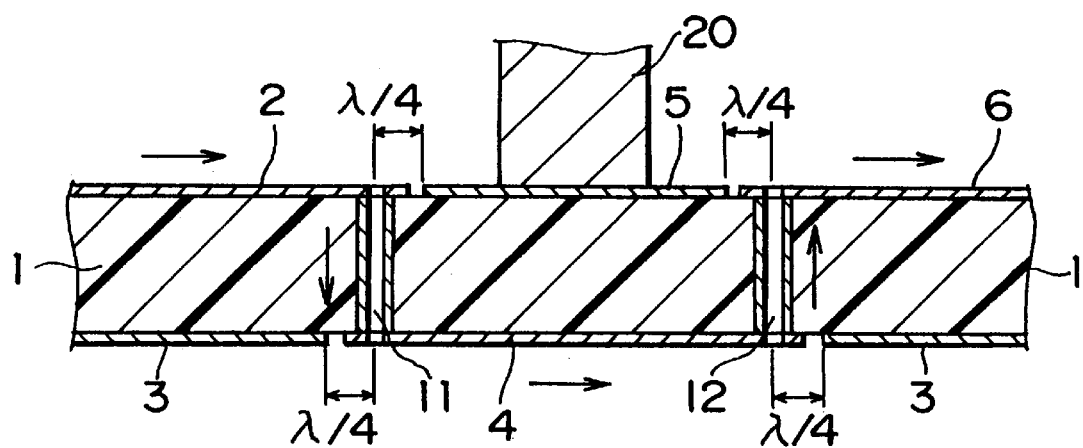
FIG. 2 is a sectional view taken along the line II—II of FIG. 1.

FIG. 2 shows a sectional view taken along the line II—II of FIG. 1. There are gaps between the first grounding conductor 3 and upper ends of the connecting through holes 11, 12 and between the second grounding conductor 5 and lower ends of the connecting through holes 11, 12, respectively, such that discontinuous portions in transmission characteristics as microstrip lines have taken place. However, the distance from end faces of the first, second grounding conductors 3, 5 to the center points of the connecting through holes 11, 12, respectively, is set to $\lambda/4$ ($\lambda$: signal wavelength), by which deterioration in the transmission characteristics due to the discontinuous portions of the gaps between the first, second grounding conductors 3, 5 and the connecting through holes 11, 12 is suppressed. That is, even if a signal propagating along the first microstrip line formed with the dielectric substrate 1 sandwiched between the first strip conductor 2 and the first grounding conductor 3 is reflected by the second grounding conductor 5, the electromagnetic wave signal propagates from the first microstrip line to the connecting through hole 11 without being affected by reflected waves because the distance from the end face of the second grounding conductor 5 to the center point of the connecting through hole 11 is $\lambda/4$. In addition, a signal propagates to the connecting through hole 12 in a similar manner.

In the transmission circuit using a strip line of this construction, a signal inputted to the signal input portion 21 propagates along the first microstrip line formed with the dielectric substrate 1 sandwiched between the first strip conductor 2 and the first grounding conductor 3, and propagates via the connecting through hole 11 to the second microstrip line formed with the dielectric substrate 1 sandwiched between the second strip conductor 4 and the second grounding conductor 5. Then, the signal propagates from the second microstrip line via the connecting through hole 12 to the third microstrip line formed with the dielectric substrate 1 sandwiched between the third strip conductor 6 and the first grounding conductor 3. Thus, the signal is outputted from the signal output portion 22 of the third strip conductor 6.

In this way, one end of the first strip conductor 2 and one end of the second strip conductor 4 are electrically connected to each other via the connecting through hole 11, and the other end of the second strip conductor 4 and one end of the third strip conductor 6 are electrically connected to each other via the connecting through hole 12, by which the first microstrip line, the second microstrip line and the third microstrip line are coupled with one another so that the transmission line for transmitting a microwave signal is bent into a crank-like shape as indicated by arrows in FIG. 2 so as to avoid the metal shielding plate 20 provided on the top surface side of the dielectric substrate 1. Accordingly, without using any internal metal chassis or connecting pins or the like, the transmission line can be formed in three dimensions with simple construction and low cost while a high reliability can be obtained. Also, in this transmission circuit using a strip line, the transmission characteristics become stable so that impedance adjustment can be easily made dispensable.

Also in this transmission circuit, in the case where the impedance of the first microstrip line formed with the dielectric substrate 1 sandwiched between the first strip conductor 2 and the first grounding conductor 3 and the impedance of the third microstrip line formed with the dielectric substrate 1 sandwiched between the third strip conductor 6 and the first grounding conductor 3 are made different from each other, for example when the impedance of the first microstrip line is 75Ω and the impedance of the third microstrip line is 50Ω, an impedance matching between the first and third microstrip lines is attained by changing the impedance of the transmission line of the connecting through holes 11, 12 by changing the diameter of the connecting through holes 11, 12. For example, according to a result of an experiment under the conditions of permittivity $\epsilon$=2.6 and thickness h=0.6 mm of the dielectric substrate 1, the impedance of the transmission line of the connecting through holes 11, 12 is changed from 70 Ω to 50Ω by changing the diameter of the connecting through holes 11, 12 from 0.5 mm to 0.6 mm, by which the impedance matching is attained (however, the impedance of the transmission line of the connecting through holes 11, 12 is affected by the permittivity $\epsilon$ and thickness h of the dielectric substrate 1). In this way, the transmission characteristics can be optimized by adjusting the diameter of the through holes in response to the impedance of the microstrip lines.

Second Embodiment

Figure 3:
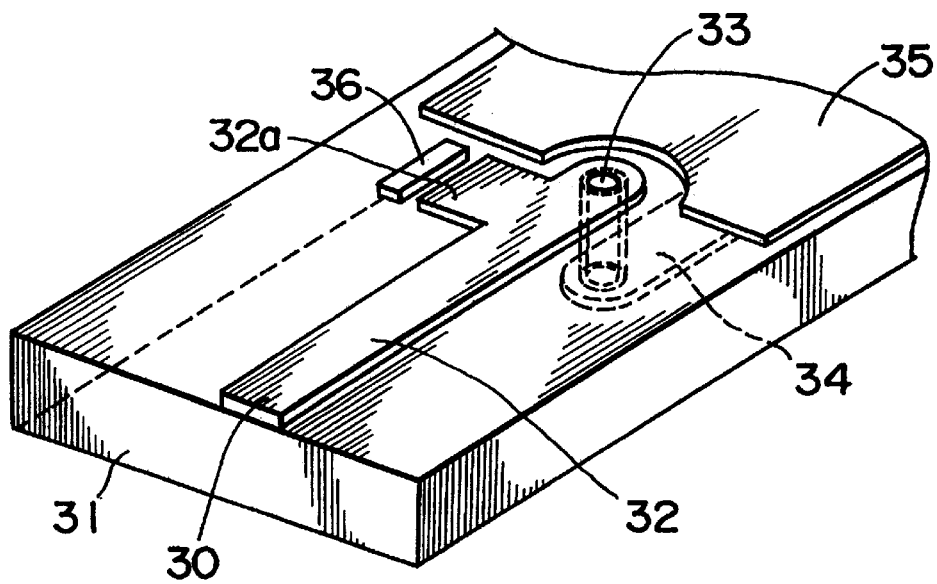
FIG. 3 is a perspective view of a transmission circuit using a strip line according to a second embodiment of the present invention.

FIG. 3 is a perspective view of a transmission circuit using a strip line according to a second embodiment of the present invention. A first strip conductor 32 is provided on the top surface side of a dielectric substrate 31 made of PTFE, while a second strip conductor 34 whose one end is connected to one end of the first strip conductor 32 via a connecting through hole 33 is provided on the bottom surface side of the dielectric substrate 31. A first grounding conductor (not shown) is provided on the bottom surface side of the dielectric substrate 31, and a second grounding conductor 35 is provided on the top surface side of the dielectric substrate 31. A first microstrip line is formed with the dielectric substrate 31 sandwiched between the first strip conductor 32 and the first grounding conductor, while a second microstrip line is formed with the dielectric substrate 31 sandwiched between the second strip conductor 34 and the second grounding conductor 35. Also, in a portion of the first strip conductor 32 near the connecting through hole 33, a branch portion 32a for impedance matching is provided so as to extend generally perpendicular to the longitudinal direction of the first strip conductor 32, while a fine-adjustment conductor pattern 36 is provided opposite to an end of the branch portion 32a with a specified spacing thereto. The branch portion 32a and the fine-adjustment conductor pattern 36 constitute an impedance matching part. In addition, the connecting through hole 33 has a cylindrical-shaped conductor provided at the inner circumference.

Unshown external circuits such as an amplifier, a filter or a mixer are connected to a signal input portion 30 of the first strip conductor 32 and a signal output portion (not shown) of the second strip conductor 34 in this transmission circuit. In this case, impedance matching between each circuit and the microstrip lines of this transmission circuit is necessary. Therefore, by the arrangement that an impedance matching part constituted by the branch portion 32a and the fine-adjustment conductor pattern 36 is provided near the connecting through hole 33 in the first strip conductor 32, it is enabled to attain an impedance matching between the first microstrip line and external circuits so that successful transmission characteristics can be obtained. Though bending the first and second microstrip lines 90° at the connecting through hole 33 is likely to cause reflection, where the higher the frequency of the microwave signal, the larger the effect of the reflected waves, an impedance matching between the first microstrip line and the connecting through hole 33 can also be attained by the impedance matching part.

Third Embodiment

Figure 4:
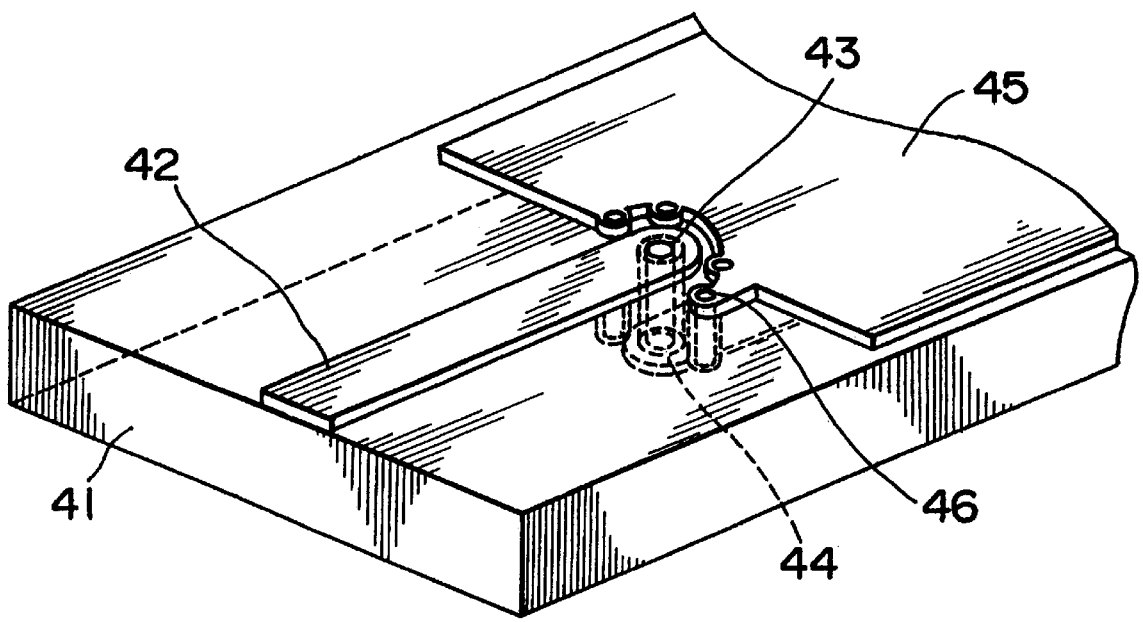
FIG. 4 is a perspective view of a transmission circuit using a strip line according to a third embodiment of the present invention.

FIG. 4 is a main-part perspective view of a transmission circuit using a strip line according to a third embodiment of the present invention. A first strip conductor 42 is provided on the top surface side of a dielectric substrate 41 made of PTFE, while a second strip conductor 44 whose one end is electrically connected to one end of the first strip conductor 42 via a connecting through hole 43 is provided on the bottom surface side of the dielectric substrate 41. A first grounding conductor (not shown) is provided on the bottom surface side of the dielectric substrate 41, and a second grounding conductor 45 is provided on the top surface side of the dielectric substrate 41. A first microstrip line is formed with the dielectric substrate 41 sandwiched between the first strip conductor 42 and the first grounding conductor, while a second microstrip line is formed with the dielectric substrate 41 sandwiched between the second strip conductor 44 and the second grounding conductor 45. Also, a plurality of grounding through holes 46 whose upper end is connected to the second grounding conductor 45 are provided so as to surround the connecting through hole 43. The connecting through hole 43 and the plurality of grounding through holes 46 each have a cylindrical-shaped conductor provided at the inner circumference.

In the transmission circuit using a strip line of this construction, by the arrangement that the connecting through hole 43 is surrounded by the plurality of grounding through holes 46, transmission characteristics equivalent to those of a cylindrical dielectric line can be obtained from the plurality of grounding through holes 46 and the connecting through hole 43. Thus, the impedance of the transmission line of the connecting through hole 43 can be made stable so that successful transmission characteristics can be obtained at high frequency and wide band.

In addition, in this transmission circuit, according to experiment results, more successful transmission characteristics of the connecting through hole 43 can be obtained by lessening the diameter of the plurality of grounding through holes 46 and by providing the most possible grounding through holes 46 around the connecting through hole 43. Further, although one end of the plurality of grounding through holes 46 has been electrically connected to the second grounding conductor 45, it may also be connected to the first grounding conductor, or the connecting through hole 43 may be surrounded by the grounding through holes connected to both the first grounding conductor and the second grounding conductor 45.

Fourth Embodiment

Figure 5:
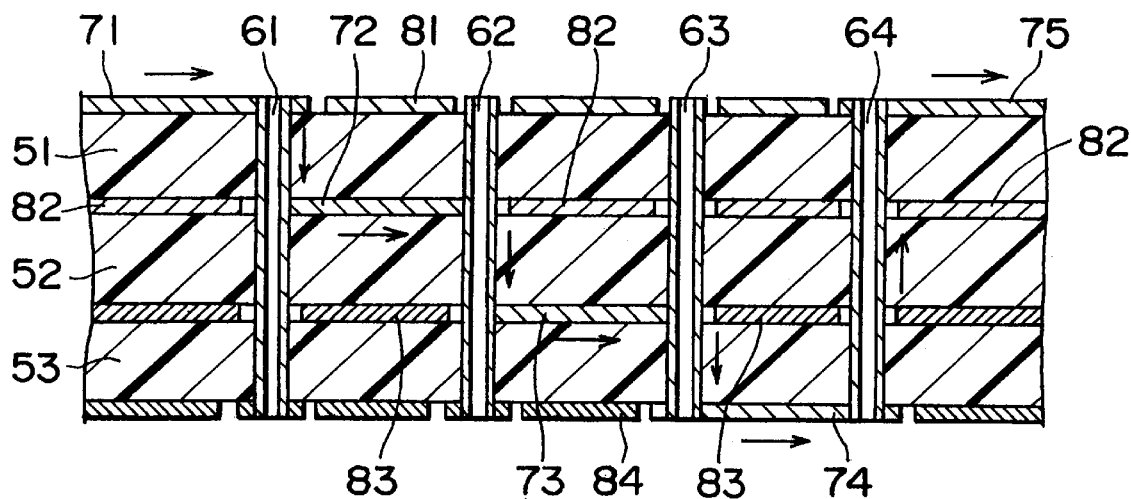
FIG. 5 is a perspective view of a transmission circuit using a strip line according to a fourth embodiment of the present invention.
Figure 6:
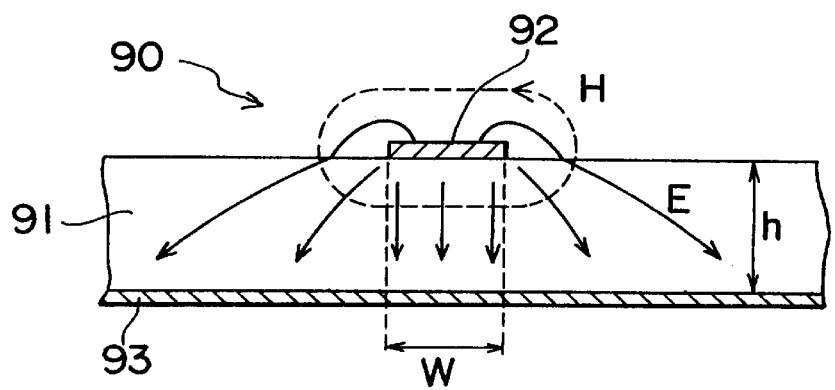
FIG. 6 is a schematic sectional view for explaining a microstrip line.
Figure 7:
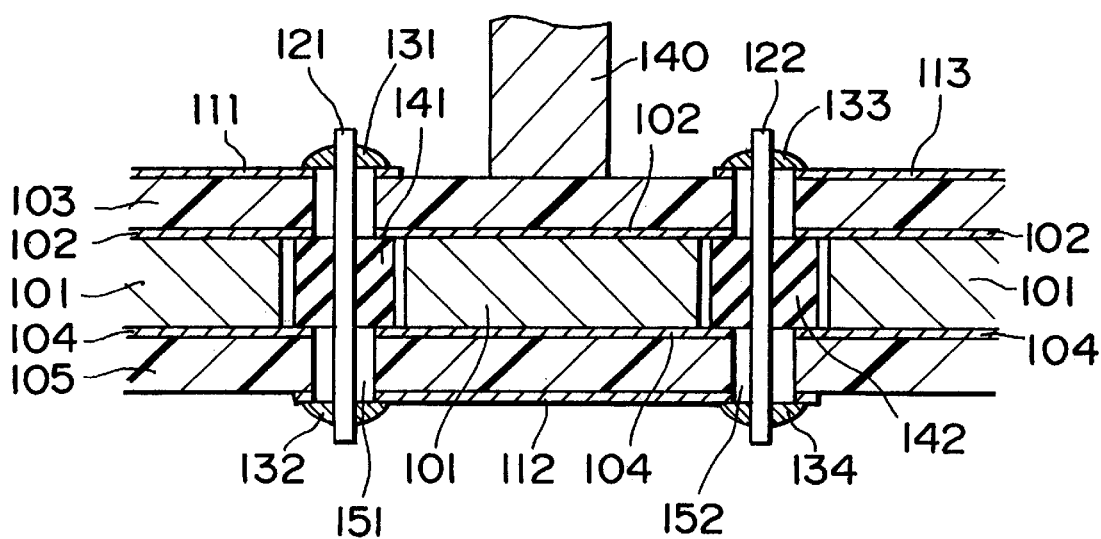
FIG. 7 is a sectional view of a transmission circuit using a strip line according to the prior art.

FIG. 5 is a sectional view of a transmission circuit using a strip line according to a fourth embodiment of the present invention. This transmission circuit has a multi-layer substrate formed by stacking up dielectric substrates 51 to 53, which are made of PTFE, with specified intervals. Connecting through holes 61 to 64 are formed in the multi-layer substrate with specified intervals, while a strip conductor 71 whose one end is connected to an upper end of the connecting through hole 61 is provided on the top surface side of the dielectric substrate 51. A strip conductor 72 that connects the connecting through hole 61 and the connecting through hole 62 to each other is provided between the dielectric substrate 51 and the dielectric substrate 52, while a strip conductor 73 that connects the connecting through hole 62 and the connecting through hole 63 to each other is provided between the dielectric substrate 52 and the dielectric substrate 53. Further, a strip conductor 74 that connects the connecting through hole 63 and the connecting through hole 64 to each other is provided on the bottom surface side of the dielectric substrate 53, while a strip conductor 75 whose one end is connected to an upper end of the connecting through hole 64 is provided on the top surface side of the dielectric substrate 51. Also, a grounding conductor 81 is provided on part of the top surface side of the dielectric substrate 51 excluding the first, and fifth strip conductors 71, 75 and their peripheries as well as the connecting through holes 61 to 64 and their peripheries, while a grounding conductor 82 is provided between the dielectric substrate 51 and the dielectric substrate 52 and on part excluding the second strip conductor 72 and its periphery as well as the connecting through holes 61 to 64 and their peripheries. Also, a grounding conductor 83 is provided between the dielectric substrate 52 and the dielectric substrate 53 and on part excluding the third strip conductor 73 and its periphery as well as the connecting through holes 61 to 64 and their peripheries, while a grounding conductor 84 is provided on part of the bottom surface side of the dielectric substrate 53 excluding the fourth strip conductor 74 and its periphery as well as the connecting through holes 61 to 64 and their peripheries. In addition, the grounding conductors 81 to 84 are electrically connected to the chassis or the like of a product as unshown.

In the transmission circuit using a strip line of this construction, a microwave signal inputted to an unshown signal input portion of the strip conductor 71 propagates along a first microstrip line where the dielectric substrate 51 is sandwiched between the strip conductor 71 and the grounding conductor 82, and propagates via the connecting through hole 61 to a second microstrip line where the dielectric substrate 51 is sandwiched between the strip conductor 72 and the grounding conductor 81 and where the dielectric substrate 52 is sandwiched between the strip conductor 72 and the grounding conductor 83. Then, from the second microstrip line, the signal propagates via the connecting through hole 62 to a third microstrip line where the dielectric substrate 52 is sandwiched between the strip conductor 73 and the grounding conductor 82 and where the dielectric substrate 53 is sandwiched between the strip conductor 73 and the grounding conductor 84. Next, from the third microstrip line, the signal propagates via the connecting through hole 63 to a fourth microstrip line where the dielectric substrate 53 is sandwiched between the strip conductor 74 and the grounding conductor 83. Then, from the fourth microstrip line, the signal propagates via the connecting through hole 64 to a fifth microstrip line where the dielectric substrate 51 is sandwiched between the strip conductor 75 and the grounding conductor 82. From an unshown signal output portion of the fifth strip conductor 75, the signal is outputted. Thus, a microwave signal propagates along the three-dimensional transmission line (as indicated by arrows in FIG. 5).

In this way, by connecting the individual strip conductors 71 to 75 to one another by means of the connecting through holes 61 to 64, the first to fifth microstrip lines formed by using the strip conductors 71 to 75 are coupled with one another so that the transmission line for transmitting a microwave signal is bent so as to avoid, for example, a metal shielding plate or the like provided on the multi-layer substrate. Accordingly, without using any internal metal chassis or connecting pins or the like, the transmission line can be formed in three dimensions with simple construction and low cost and a transmission circuit using a strip line having a high reliability can be realized. Also, this transmission circuit using a strip line, when applied to the multi-layer technique of microwave transmission circuits, allows the circuit area to be reduced to a large extent, and enough capable of high-density mounting.

In this transmission circuit, indeed either one of the upper and lower grounding conductors for the inner-layer second, and third strip conductors 72, 73 may be selected, whichever it is, to make up a microstrip line, but experiment results showed that for microwaves of 10 GHz or more, where effects of the coupling of upper and lower grounding conductors would be involved, more stable transmission characteristics can be obtained when both upper and lower grounding conductors are selected to make up the microstrip line. Further, the impedance of the transmission lines of the connecting through holes 61 to 64 that connect the strip conductors 71 to 75 of the respective layers to one another is largely affected by the permittivity $\epsilon$ and thickness h of the dielectric substrates 51 to 53 and the like, so that an optimization of the diameter of the connecting through holes needs to be performed as in the first embodiment.

The first to fourth embodiments have been described on transmission circuits using microstrip lines as an example of the strip line. However, without being limited to this, the strip line may be a coplanar line or the like.

Further, in the first to fourth embodiments, the dielectric substrates 1, 31, 41, 51 to 53 made of PTFE (polytetrafluoroethylene) have been employed. However, the material of the dielectric substrates is not limited to PTFE as a matter of course.

In the second embodiment, the branch portion 32a and the fine-adjustment conductor pattern 36 have been employed as an impedance matching part. However, the impedance matching part may also be either one of a branch portion or a fine adjustment pattern. Further, the position of the impedance matching part may be other than near the connecting through holes in the first, second strip conductors.

Although the fourth embodiment has been described on a four-layered multi-layer substrate, the present invention may be applied to multi-layer substrates of two, three, five or more multi-layer substrates.

As apparent from the above description, the transmission circuit using a strip line according to the present invention comprises a first strip line having a first strip conductor provided on the top surface side of a dielectric substrate, and a second strip line having a second strip conductor provided on the bottom surface side of the dielectric substrate, where one end of the first strip conductor and one end of the second strip conductor are electrically connected to each other via a connecting through hole.

Accordingly, with the transmission circuit using a strip line of the present invention, since the first strip line having the first strip conductor and the second strip line having the second strip conductor are coupled with each other by the connecting through hole, the transmission line for transmitting a microwave or other signal is bent into a crank shape so that the transmission line can be formed in three dimensions with simple construction and low cost without using any internal metal chassis or connecting pins or the like, and moreover high reliability can be obtained. Furthermore, this transmission circuit using a strip line becomes stable in transmission characteristics, so that impedance adjustment can be easily made dispensable.

Also, the transmission circuit using a strip line according to the present invention comprises a strip line having a strip conductor provided on at least one of the top and bottom surface sides of a multi-layer substrate formed by stacking up a plurality of dielectric substrates with specified intervals, and a strip line having a strip conductor provided in at least one of gaps between the dielectric substrates, where the strip conductors are connected to one another via connecting through holes which are provided so as to pass through the multi-layer substrate.

Accordingly, with this transmission circuit using a strip line of the present invention, the strip conductors are connected to one another by means of the connecting through holes, by which the strip lines formed by using the strip conductors are coupled with one another so that the transmission line for transmitting a microwave or other signal is bent. Thus, without using any internal metal chassis or connecting pins or the like, the transmission line can be formed in three dimensions with simple construction and low cost, while a high reliability can be obtained. Furthermore, the transmission characteristics become stable so that impedance adjustment can be easily made dispensable. Therefore, this transmission circuit using a strip line, when applied to the multi-layer technique of microwave transmission circuits, allows the circuit area to be reduced to a large extent and capable of high-density mounting.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A transmission circuit using a strip line, comprising:

a dielectric substrate;

a first strip line having a first strip conductor provided on a top surface of the dielectric substrate and a first grounding conductor provided on a bottom surface of the dielectric substrate;

a second strip line having a second strip conductor provided on a bottom surface of the dielectric substrate and a second grounding conductor provided on a top surface of the dielectric substrate; and a connecting through hole provided in the dielectric substrate, with one end of the connecting through hole electrically connected to one end of the first strip conductor and the other end of the connecting through hole electrically connected to one end of the second strip conductor;

wherein a distance from a center of the connecting through hole to the first and second grounding conductors is $\lambda/4$ ($\lambda$: signal wavelength).

2. The transmission circuit using a strip line according to claim 1, wherein impedance adjustment of the connecting through hole is attained by adjusting diameter of the connecting through hole.

3. The transmission circuit using a strip line according to claim 1, wherein an impedance matching part is provided in at least one of the first strip conductor and the second strip conductor.

4. The transmission circuit using a strip line according to claim 1, further comprising a plurality of grounding through holes which are provided in the dielectric substrate so as to surround the connecting through hole and which are electrically connected to the grounding conductor of at least one of the first strip line and the second strip line.

5. A transmission circuit using a strip line, comprising:

a dielectric substrate;

a first strip line having a first strip conductor, which includes a longitudinal portion and a branch portion perpendicular to the longitudinal portion, provided on a top surface of the dielectric substrate and a first grounding conductor provided on a bottom surface of the dielectric substrate;

a second strip line having a second strip conductor provided on a bottom surface of the dielectric substrate and a second grounding conductor provided on a top surface of the dielectric substrate; and a connecting through hole provided in the dielectric substrate, with one end of the connecting through hole electrically connected to one end of the first strip conductor and the other end of the connecting through hole electrically connected to one end of the second strip conductor.

6. The transmission circuit using a strip line according to claim 5, wherein an impedance matching part is provided in at least one of the first strip conductor and the second strip conductor.

7. The transmission circuit using a strip line according to claim 6, wherein the impedance matching part includes a fine-adjusting part adjacent to and spaced from the branch portion.

* * * * *